US006967705B2

(12) United States Patent
Farquhar et al.

(10) Patent No.: US 6,967,705 B2
(45) Date of Patent: Nov. 22, 2005

(54) LAMINATION OF LIQUID CRYSTAL POLYMER DIELECTRIC FILMS

(75) Inventors: Donald S. Farquhar, Endicott, NY (US); Mark D. Poliks, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/925,021

(22) Filed: Aug. 25, 2004

(65) Prior Publication Data

US 2005/0019527 A1 Jan. 27, 2005

Related U.S. Application Data

(62) Division of application No. 10/263,851, filed on Oct. 3, 2002, now Pat. No. 6,819,373.

(51) Int. Cl.[7] .................................................. G02F 1/13
(52) U.S. Cl. ...................................................... 349/193
(58) Field of Search ......................................... 349/193

(56) References Cited

U.S. PATENT DOCUMENTS

| | | | |
|---|---|---|---|
| 4,942,095 A | 7/1990 | Buchert et al. | |
| 5,259,110 A | 11/1993 | Bross et al. | |
| 5,346,747 A | 9/1994 | Vancho et al. | |
| 5,558,928 A | 9/1996 | DiStefano et al. | |
| 5,565,267 A | 10/1996 | Capote et al. | |
| 5,592,737 A | 1/1997 | Middelman et al. | |
| 5,670,262 A | 9/1997 | Dalman | |
| 5,874,152 A | 2/1999 | Middelman | |
| 6,016,598 A | 1/2000 | Middelman et al. | |
| 6,093,344 A | 7/2000 | Park et al. | |
| 6,114,005 A | 9/2000 | Nagai et al. | |
| 6,124,004 A | 9/2000 | Furuta et al. | |
| 6,163,957 A | 12/2000 | Jiang et al. | |
| 6,274,242 B1 | 8/2001 | Onodera et al. | |
| 6,323,436 B1 | 11/2001 | Hedrick et al. | |
| 6,329,603 B1 | 12/2001 | Japp et al. | |
| 6,433,843 B1 | 8/2002 | Okada et al. | |
| 6,532,046 B1 | 3/2003 | Yamashita et al. | |
| 2001/0006727 A1 * | 7/2001 | Lee et al. | 428/373 |
| 2002/0028293 A1 * | 3/2002 | Yang et al. | 427/304 |

* cited by examiner

*Primary Examiner*—James A. Dudek
(74) *Attorney, Agent, or Firm*—Schmeiser, Olsen & Watts; William H. Steinberg

(57) ABSTRACT

A multi-layered structure and method of formation. A page is generated by stacking N substructures (N≧2) in an ordered sequence. A first substructure of each pair of adjacent substructures comprises liquid crystal polymer (LCP) dielectric material to be bonded with a second substructure of a pair of the adjacent substructure. The page is subjected to a temperature less than the lowest nematic-to-isotropic transition temperature of the LCP dielectric materials within the page. The dwell time and elevated pressure are sufficient to cause all LCP dielectric material within the page to plastically deform and laminate each pair of adjacent substructures without any extrinsic adhesive layer disposed between the first and second substructures of each pair of adjacent substructures.

14 Claims, 8 Drawing Sheets

LAMINATION OF LIQUID CRYSTAL POLYMER DIELECTRIC FILMS

This application is a divisional of Ser. No. 10/263,851; filed on Oct. 3, 2002, now U.S. Pat. No. 6,819,373.

TECHNICAL FIELD

The present invention relates to lamination of liquid crystal polymer (LCP) dielectric films to form multilayer laminate structures.

RELATED ART

Organic substrates comprising multilayer laminates have been and continue to be developed for many applications. However, it would be desirable to reduce costs and inefficiencies that currently characterize fabrication of multilayer laminates.

SUMMARY OF THE INVENTION

In first embodiments, the present invention provides a multi-layered structure, comprising:

a first layer; and a second layer, wherein the first layer comprises a first liquid crystal polymer (LCP) dielectric material, and wherein the first layer is bonded to the second layer such that the first LCP material is directly bonded to the second layer with no extrinsic adhesive material bonding the first LCP material to the second layer.

In second embodiments, the present invention provides a method of making a multi-layered structure, comprising the steps of:

generating a page including stacking N substructures in an ordered sequence such that N is at least 2, wherein a first substructure of each pair of adjacent substructures comprises liquid crystal polymer (LCP) dielectric material to be bonded with a second substructure of said pair of adjacent substructures; and subjecting the page to a temperature less than the lowest nematic-to-isotropic transition temperature of the LCP dielectric materials within the page, for a dwell time and at an elevated pressure that is sufficient to cause all LCP dielectric material within the page to plastically deform and laminate each pair of adjacent substructures without any extrinsic adhesive layer disposed between the first and second substructures of each pair of adjacent substructures.

The present invention advantageously reduces processing time and processing costs, and reduces dielectric layer thickness, in the fabrication of multilayer laminates.

DETAILED DESCRIPTION OF THE INVENTION

Figure 1:
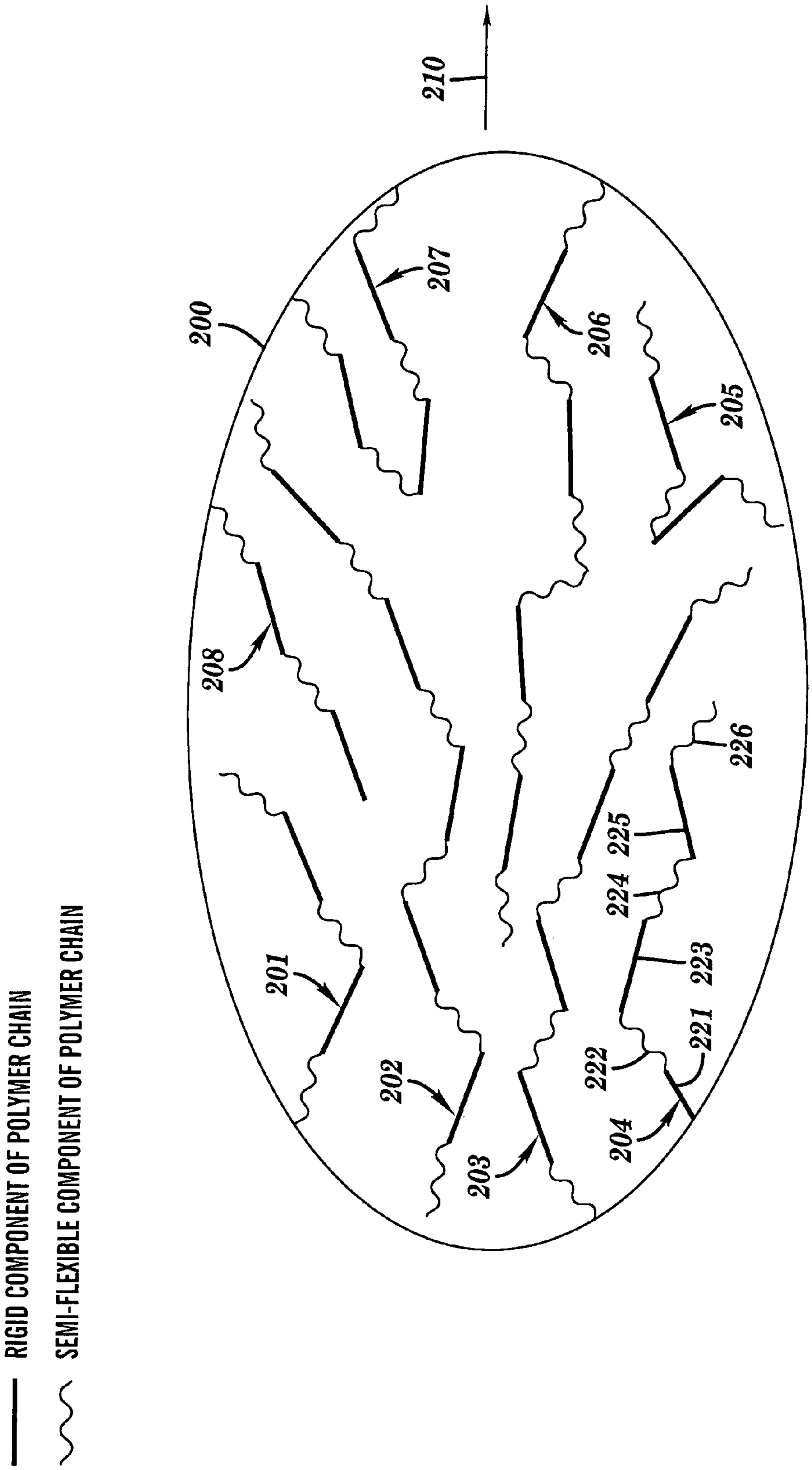
FIG. 1 depicts a localized molecular domain in the liquid crystal phase of a liquid crystal polymer (LCP) dielectric, with directional ordering of polymer chains, in accordance with embodiments of the present invention.

Liquid crystal polymer (LCP) dielectric materials have many positive attributes for forming dielectric layers, including good dielectric properties, low cost, and good mechanical properties. LCP dielectric materials have some characteristics similar to those of polyimides, such as good tear resistance and good stretching resistance, which make LCP dielectric materials suitable for processing (e.g., cicuitizing, plating, etc.) in very thin layers. LCP films may offer advantages over polyimide films such as better electrical properties, better moisture resistance, better dimensional stability, and lower cost. However, to form multilayer structures with either LCP or polyimide films generally requires the use of adhesive dielectric films. The present invention discloses how to cause LCP dielectric material to adhere to a layer of material (e.g., a metal layer or a dielectric layer) without need for an extrinsic intervening adhesive layer, which reduces layer thickness, processing costs, and material costs. In addition, LCP dielectric films of this type are flame retardant without the use of halogen based additives. Multilayer composites made with these dielectrics may also be flame retardant without the use of halogens.

A commercially available LCP dielectric material that may be used in conjunction with the present invention is the BIAC thermotropic liquid crystal polymers which exhibit thermoplastic behavior and are manufactured in sheet or roll form by W. L. Gore & Associates, Inc. Information on the BIAC liquid crystal polymers may be obtained at the web site: http//www.gore.com/electronics. Another commercially available LCP dielectric material that may be used in conjunction with the present invention is the ZYVEX LCP thermotropic liquid crystal polymers which exhibit thermoplastic behavior and are manufactured in roll form by the Rogers Corporation. Generally, any LCP dielectric material is potentially usable with the present invention, depending on the material properties desired in a given application.

U.S. Pat. No. 6,274,242 (Onodera et al. 2001) ("Onodera '242"), hereby incorporated by reference in its entirety, discloses a method of making LCP films which include well known thermotropic liquid crystal polyester and thermotropic liquid crystal polyester amide. Said LCP films are prepared from four classes of compounds identified in Tables 1–4 of Onodera '242. Examples of resultant LCP structural units derived from the four classes of compounds are illustrated in Table 5 of Onodera '242. The LCP dielectrics disclosed in Onodera '242 are merely exemplary, and many other LCP dielectrics are within the scope of the present invention. Generally, any method known to one of ordinary skill in the art may be used to make the LCP dielectric material.

A LCP dielectric may exist in one of three phases: a liquid crystal phase (e.g., nematic, smectic, cholesteric), an isotropic phase, and a chemically unstable phase, which respectively correspond to three temperature domains, namely a liquid crystal temperature domain, an isotropic temperature domain, and a chemically unstable temperature domain.

In the liquid crystal phase or liquid crystal temperature domain, localized molecular regions or domains of the LCP dielectric comprise polymer chains which are directionally ordered (i.e., anisotropically distributed) such as by processing. In the liquid crystal phase, different localized molecular domains may have different directional ordering, and many localized molecular domains may have little or no directional ordering. These polymer chains are typically less than fully rigid. Such a localized molecular domain having directional ordering may include domains of molecules and/or groups of adjacent molecules, such that the spatial extent of the localized molecular domain is of the order of a thousand or hundreds of angstroms or less. Macroscopic material properties of the LCP dielectric (e.g., coefficient of thermal expansion(CTE), dielectric constant, thermal conductivity, etc.) are sensitive to the directional order in the localized molecular regions, and material properties of LCP dielectric materials are anisotropic in accordance with the directional ordering. The macroscopic material properties of the LCP dielectric are also dependent on the shape, size, shape distribution, and size distribution of the localized molecular regions.

The LCP dielectric material is manufactured by techniques known to one of ordinary skill in the art to produce a directional ordering that provides the desired material properties in the liquid crystal phase. Such techniques may include, inter alia, two-dimensional shear imparted to the LCP dielectric material through film extrusion or through stretching in the roll direction and stretching in the direction normal to the roll direction, as the LCP dielectric material is being unrolled at a prescribed temperature and velocity. The shear may alternatively be imparted by strong polarizing electric fields.

The LCP dielectric material remains in the liquid crystal phase if its temperature is in the liquid crystal temperature range; i.e., below a temperature called the nematic-to-isotropic transition temperature ($T_{NI}$). Thus, $T_{NI}$ represents the transition from the liquid crystal phase to the isotropic phase of a LCP dielectric material. The numerical value of $T_{NI}$ depends of the specific LCP dielectric material being utilized. Additionally, the directional ordering and consequent macroscopic material properties of the LCP dielectric material are essentially invariant to changes in temperature provided that the temperature remains within the liquid crystal temperature range and does not depart from the liquid crystal temperature range. Macroscopic material properties are preserved as temperature is varied within the liquid crystal temperature domain, because there is insufficient thermal energy in the liquid crystal phase to reorient the directionality of polymer chains of the LCP dielectric material (i.e., to overcome the inter-molecular attractive forces).

The LCP dielectric material plastically deforms when subject to high pressure in the liquid crystal phase. For example, in the manufacturing of chip carriers, the high pressure may result from a combination of applied normal pressure and local geometrical irregularities such as stress concentrations resulting from surface roughness, signal lines, vias, etc. Thus if the LCP dielectric material is laminated to a layer of material (comprising dielectric, metal, etc.) at high pressure and at elevated temperature within the liquid crystal phase, then the LCP dielectric material will plastically deform and conform to the macroscopic geometry of the surface and surface features (e.g., vias) of the layer of material. This capability of the LCP dielectric material to plastically conform, under sufficient pressurization while in the liquid crystal phase during the dwell time, to the surface and surface features of an adjacent layer is an unexpected result determined through experimentation by the inventors of the present invention, and serves as a foundational basis for the present invention. With the present invention, LCP dielectric material may be laminated to an adjacent surface of a layer of material through elevation of temperature within the liquid crystal temperature domain, and under sufficient pressurization to induce plastic deformation and consequent adhesion to the adjacent surface, while preserving its macroscopic material properties. This process of plastic adhesion does not require the presence of an extrinsic adhesive layer to bond the LCP dielectric material to the adjacent layer.

FIG. 1 depicts a localized molecular domain 200 in the nematic type liquid crystal phase with directional ordering of polymer chains, in accordance with embodiments of the present invention. The domain 200 includes polymer chains 201–208 ordered directionally such that the average directional orientation, angularly integrated over the directional orientations of the polymer chains 201–208, is approximately in the direction 210. Such angular integration may be performed in various ways as is known to one of ordinary skill in the art (e.g., different components of a given polymer chain may be weighted differently in the angular integration). Regardless of this specific definition used to define the angular average, however, the angular distribution of the directional orientations is clearly anisotropic such that there is a preferred direction at or near the direction 210.

In this illustration, each of polymer chains 201–208 is shown as a linear chain of alternating rigid and semi-flexible components. For example, polymer chain 204 comprises the sequence of polymer components 221–226, wherein components 221, 223, and 225 are rigid components, and wherein components 222, 224, and 226 are semi-flexible components. An example of a rigid component is a polymer having a polymer backbone that includes repeating units of substituted aromatic rings (e.g., benzene, biphenyl, naphthalene, etc.) such as disclosed in U.S. Pat. No. 6,274,242 (Onodera et al, see Tables 1, 2, 3, 4, and 5) and U.S. Pat. No. 5,900,292 (Moriya, see formulae 1, 2, 3, and 4). The rigid component may have reactive functional groups (e.g., hydroxy, amine, cyanate, carboxylic acid, and combinations thereof, etc.). An example of a semi-flexible component is a polymer having a polymer backbone that includes repeating units such as aliphatic segments (e.g., oxymethylene units, oxyethylene units, vinyl ether units, siloxanes units, etc.). The semi-flexible component may have chemically functional groups (e.g., hydroxy, amine, cyanate, carboxylic acid, and combinations thereof, etc.). Such a polymer may be prepared in two ways. First, the ends of adjacent rigid and semi-flexible components may be chemically coupled to each other to form esters, ethers, amides, etc. links in the polymer chain. Second, the ends of adjacent rigid components may be chemically coupled to each other to form ester, ether, amides (etc.) links in the polymer chain. In this second case, the links or connecting segments (esters, ethers, amides, etc.) would be the only semi-flexible component.

While FIG. 1 shows polymer chains 201–208 as each being a linear chain of alternating rigid and semi-flexible components, any linear chain of rigid and semi-flexible components (e.g., a non-alternating sequence of rigid and semi-flexible components) is within the scope of a localized molecular domain. While FIG. 1, shows polymer chains 201–208 as each being a linear chain of components, any polymer chain topography is within the scope of a localized molecular domain. For example, a localized molecular domain may also or alternatively include a chain structure that comprises one or more side chains linked to a linear chain. While FIG. 1, shows a two-dimensional representation of linear chains, the localized molecular domain generally has chain structures which are oriented in three-dimensional space. For example, portions of any of the polymer chains 201–208 may extend above or below the depicted plane shown in FIG. 1. Accordingly, FIG. 1 may be viewed as a projection of a three-dimensional localized molecular domain onto a two-dimensional surface and the chains pictured may continue above and below the depicted plane.

In the isotropic phase or isotropic temperature domain, which exists at temperatures at or above the nematic-to-isotropic transition temperature ($T_{NI}$), there is sufficient available thermal energy to permit molecular diffusion and motion to change the directional ordering within the LCP dielectric. Thus as temperature changes from below $T_{NI}$ to above $T_{NI}$, there is a loss of directional order and the directional orientations become more random. As a consequence, macroscopic material properties will generally change in the temperature transition from below $T_{NI}$ to above $T_{NI}$, since the macroscopic material properties are sensitive to direction orientations of polymer chains in the LCP dielectric material, as described supra. When lamination of LCP dielectric material to a layer of material is performed at a temperature in the isotropic temperature range, the LCP dielectric material softens and liquifies and thus flows into the macroscopic geometry of the surface and surface features of the layer of material. Upon subsequent cooling its thermal history and processed-in directional order is changed. In contrast, when lamination of LCP dielectric material to a layer of material is performed at a temperature in the liquid crystal temperature range with sufficient pressurization, the LCP dielectric material does not flow but rather plastically deforms into the macroscopic geometry of the surface and surface features of the layer of material, as explained supra. The present invention teaches lamination of LCP dielectric material to a layer of material only at a temperature in the liquid crystal temperature range and thus teaches an invention that preserves macroscopic material properties during the laminating process. The lower temperature in the liquid crystal temperature range prevents any risk of the material melting or of domain re-orientation of large regions. An additional advantage is that no extrinsic adhesive layer is needed to bond the LCP dielectric material to the layer of material.

Figure 2:
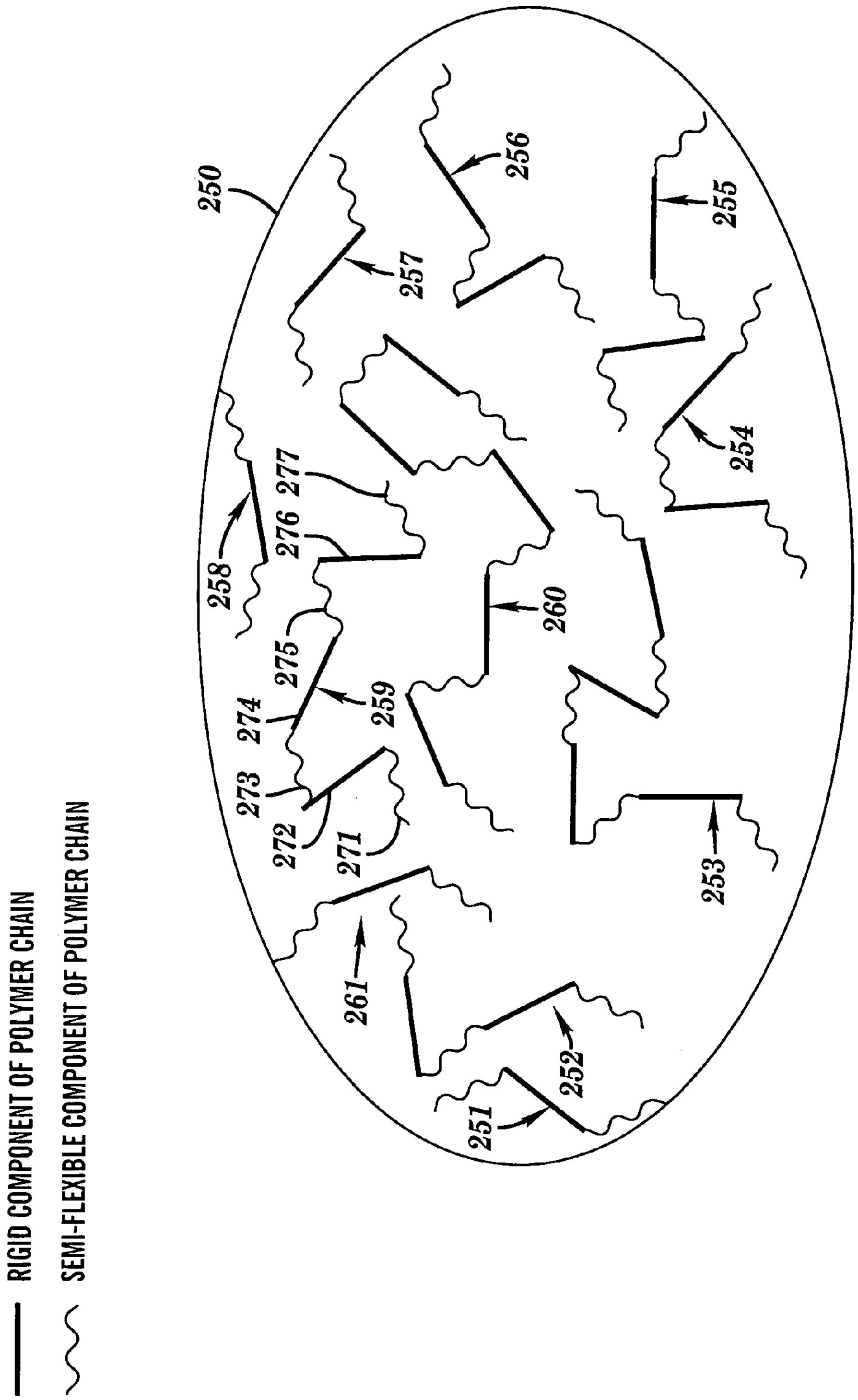
FIG. 2 depicts a localized molecular domain in the isotropic phase of a LCP dielectric, with little or no directional ordering of polymer chains, in accordance with embodiments of the present invention.

FIG. 2 depicts a localized molecular domain 250 in the isotropic phase in which there is little or no directional ordering of polymer chains, in accordance with embodiments of the present invention. The domain 250 includes polymer chains 251–260 ordered directionally such that the average directional orientation, angularly integrated over the directional orientations of the polymer chains 251–261, is approximately "zero"; i.e., there is essentially no preferred angular orientation or direction associated with the domain 250.

Each of polymer chains 251–260 is shown as a linear chain of alternating rigid and semi-flexible components. For example polymer chain 259 comprises the sequence of polymer components 271–277, wherein components 271, 273, 275, and 277 are semi-flexible components, and wherein components 272, 274, and 276 are rigid components. The rigid and semi-flexible components in the polymer chains of FIG. 2 are respectively analogous to the rigid and semi-flexible components in the polymer chains of FIG. 1, and the examples of rigid and semi-flexible polymer components discussed supra in conjunction with FIG. 1 likewise apply to the rigid and semi-flexible components of FIG. 2.

While FIG. 2 shows polymer chains 251–260 as each being a linear chain of alternating rigid and semi-flexible components, any linear chain of rigid and semi-flexible components (e.g., a non-alternating sequence of rigid and semi-flexible components) is within the scope of a localized molecular domain. While FIG. 2, shows polymer chains 251–260 as each being a linear chain of components, any polymer chain topography is within the scope of a localized molecular domain. For example, a localized molecular domain may also or alternatively include a chain structure that comprises one or more side chains linked to a linear chain. While FIG. 2, shows a two-dimensional representation of linear chains, the localized molecular domain generally has chain structures which are oriented in three-dimensional space. For example, portions of any of the polymer chains 251–260 may extend above or below the depicted plane shown in FIG. 2. Accordingly, FIG. 2 may be viewed as a projection of a three-dimensional localized molecular domain onto a two-dimensional surface and the chains pictured may continue above and below the depicted plane.

In the chemically unstable phase or chemically unstable temperature domain, which occurs at significantly higher temperatures than the nematic-to-isotropic transition temperature ($T_{NI}$), there is sufficient available thermal energy to cause chemical decomposition within the LCP dielectric. The chemically unstable phase is not relevant to the present invention.

The present invention discloses a method for bonding LCP dielectric material to a layer of material (e.g., a dielectric layer or a metal layer or a combination thereof). As background for the present invention, the following discussion describes tests performed by the inventors of the present invention. In tests dating to 1994, the present inventors have attempted melt processing of LCPs, as known and taught in the art, to build multi-layer structures, with the approach of using precise temperature control to laminate the materials at temperatures just above or just below the "melting" temperature (i.e., $T_{NI}$) as determined by differential scanning calorimetry and by parallel plate rheometry. These experiments are characterized by inconsistent results in adhesion, laminate thickness, edge squeeze out, and importantly the physical properties of resulting laminate. Of particular note are the inconsistent changes that occurred in the coefficient of thermal expansion. This is a clear indication that the properties of the base laminate have been changed, essentially destroying their utility for the use intended, and therefore requiring the use of adhesive layers to form multi-layer circuits.

In contrast, experiments performed during June through September of 2002 have shown that by lowering the temperature to below $T_{NI}$, consistent adhesion is achieved without altering the properties of the base laminate. For example, Gore BIAC material, having a 2 mil thickness with 15 um of copper cladding on each side, was utilized. Etching away the copper, the inventors determined that the coefficient of thermal expansion (CTE) was approximately 20 to 25 ppm/° C. as received from the vendor. A thermal mechanical analyser was used to determine the CTE in various locations on a panel that measured approximately 13×18 inches. The CTE was measured in both x-coordinate and y-coordinate directions (i.e., in the two directions that are perpendicular to the thickness direction of the BIAC layer and also perpendicular to each other). Both a film-fiber configuration and a more conventional contacting probe were used to make these measurements.

After characterizing the properties of individual plies of the LCP, multi-ply laminates were prepared. The laminates comprised 4 ply and 6 ply thick composites formed using the Gore BIAC material, from which the copper cladding had been etched away. The parts were subjected to a lamination process that involved heating to 560° F. at a heatup rate of 15° F. per minute, next followed by a dwell time of approximately 20 to 30 minutes, and then followed by cooling at approximately 20° F. per minute to room temperature. Dwell time is defined herein, including in the claims, as a time interval during which the part being laminated is subjected to the highest temperature (within a reasonable temperature tolerance of said highest temperature due to statistical scatter and other minor variations) that the part experiences during the entire lamination process, said entire lamination process including all processing steps. Note that the maximum temperature of 560° F. is less that the liquid crystal transition temperature (assumed herein to be essentially the same as $T_{NI}$) of 635° F. of the Gore BIAC material. The lamination was accomplished using a flat bed press with electrically heated steel platens. The pressure was maintained at 2500 psi throughout the processing. Stainless steel planishing plates and copper release sheets were employed, as well as interleaving layers of polytetrafluoroethylene (PTFE) and copper to make a press pad above and below the tooling. Upon removal from the press, the inventors found no evidence of dielectric squeeze out at the edges of the laminate.

The thermal mechanical analysis was repeated and determined that the x-coordinate and y-coordinate (in-plane) CTE were unaltered by the lamination process. Adhesion tests were performed, using a 180 degree pull at 1 inch per minute, and an inner layer adhesion strength in excess of 6 lbf/inch was determined.

The same lamination process was repeated to evaluate the extent to which topography associated with realistic circuit features could be accommodated. A layer of Roger 2800 dielectric (PTFE/SiO2 filler) was used, and the layer of Roger 2800 dielectric had surface features including 12 um thick Cu formed into the circuit line of 30 to 50 um in width. The layer of the Gore BIAC LCP (50 um thick) was positioned above the Roger 2800 dielectric surface and the lamination was performed at the previously described conditions. Upon removal and subsequent cross sectioning, it was found that the circuit features were completely encapsulated. As before, there was no edge squeeze out. Adhesion testing showed an inner layer adhesion strength in excess of 4 lbf/inch between the LCP and Roger 2800 dielectric.

In another experiment, standard photolithography techniques were applied to copper clad LCP (i.e., 15 um copper cladded to Gore BIAC LCP) to form a pattern of clearance holes ranging from 50 to 500 um diameter on one of the copper surfaces. A second sheet of Gore BIAC LCP (with copper removed) was placed against the side of the first sheet that had the clearance holes. After repeating the lamination process as described supra, the part was cross-sectioned and it was determined that the holes were completely filled with BIAC LCP dielectric material. Again there was no evidence of edge squeeze out, and the adhesion was consistent across the panel.

The lamination experiments were first performed in panel sizes as small as 4"×4" in an electrically heated 75 ton laboratory press with no vacuum enclosure, manufactured by PHI Corporation. The results were duplicated in an electrically heated 125 ton Wabash press with a vacuum enclosure, and finally in a 600 ton electrically heated TMP press in 13"×18" format. These larger samples were used to establish the uniformity of adhesion, hole fill, and physical properties over a panel size that would be practical in manufacturing.

Based on the preceding experiments and supplementary analysis, which are consistent with the model (described supra) of directional ordering characteristics of LCP dielectric materials as being differentiated in the liquid crystal and isotropic phases, the basic technique of the present invention for laminating a LCP dielectric material to a layer of material (e.g., a dielectric layer or a metal layer or a combination thereof) is to perform the lamination at a temperature T wholly in the liquid crystal temperature range (i.e., $T<T_{NI}$) with no excursion into the isotropic temperature range, under sufficient pressurization and for a sufficient time to cause the LCP dielectric material to be effectively laminated to the layer of material, For the Gore BIAC LCP material, $T_{NI}$ is about 635° F. For the Gore BIA LCP material, the maximum lamination temperature should be less than 635° F.; however, due to temperature uncertainties and spatial variation, a maximum processing temperature for lamination may be about 620° F., and representative lamination temperature ranges include, inter alia, 540° F. to 620° F. and 545° F. to 580° F. For the Rogers ZYVEC LCP material, $T_{NI}$ is about 536° F. For the Rogers ZYVEC LCP material, the maximum lamination temperature should be less than 536° F.; however, due to temperature uncertainties and spatial variation, a maximum processing temperature for lamination may be about 520° F., and representative lamination temperature ranges include, inter alia, 440° F. to 520° F. and 465° F. to 590° F.

Although the preceding experiments were performed at a pressure of 2500 psi, the present inventors have used pressure in the range of 1000 to 3000 psi and achieved good adhesion. It was found that an improvement in uniformity correlated with increasing pressure. The effectiveness of the pressure depends on the aspect ratio of the features that must be filled during the lamination. The testing performed by the inventors thus far indicate that a range in pressure of 2000 to 2500 psi is a particularly effective, as well as practical and economical for use in a conventional manufacturing environment. Extreme pressures can have the drawback of shortened life for the tooling and platens, and also require increased capacity for the press itself.

The dwell times used by the present inventors include keeping the material LCP dielectric pressurized at maximum temperature for durations as short as 2 to 5 minutes to durations as long as 60 minutes. It was found that no undesirable "edge squeeze out" or other evidence of excess flow occurs with the longer times, although some improvement in adhesion uniformity may result. Thus the maximum dwell time for temperature and pressure should generally be at least 2 minutes, and applicable ranges of dwell times include, inter alia, 2 to 60 minutes and 15 to 30 minutes. A minimum dwell is required to ensure temperature uniformity. However, the quality of the filling of features should improve with increasing dwell time. On the other hand, shorter times are favorable for economy of manufacturing, and the shorter dwell times reflect this goal of economy. Nonetheless, no upper limit of dwell time has been observed by virtue of the resulting properties of the laminates.

Repeating the lamination cycle twice may improve the uniformity of adhesion, and by repositioning the product in the lamination press (perhaps turning it 180 degrees), the low spots become high spots, resulting in more uniform adhesion, especially along the edges.

In accordance with the discussion of LCP dielectric materials and the testing relating to lamination of LCP dielectric materials to a layer of material, the LCP material used in the present invention may be a partially ordered liquid crystal polymer resulting from various processing steps which partially orient the microscopic liquid crystal domains directionally during the manufacturing of the LCP dielectric. Higher order smectic (i.e., orientational and positional order) phases may also be present. Although the preceding discussion focused on homogenous LCP dielectrics, the adhesiveless lamination process of the present invention is also applicable to LCP materials that contain fillers, such as ceramic or organic, particulate or fiber-like, or even metallic particles. Further, expanded PTFE as a reinforcement in LCP materials in within the scope of the present invention.

The desired material properties for the LCP dielectric material, in the context of the present invention, are application dependent. For various applications, material properties may comprise: in-plane CTE (i.e., CTE in direction perpendicular to the thickness direction of a LCP dielectric layer) of about 10 to 25 ppm/° C.; dielectric constant of about 2.5 to 3.0; Young's modulus of about 3 to 6 GPa; dissipation factor of less than about 0.003; and moisture absorption of less than about 0.2% for 96 hours at 121° C. and 2 atm. The thickness of the LCP dielectric layers can vary according to the desired design performance characteristics of the multi-layered interconnect structure, and said thicknesses may be about equal if so dictated by design performance requirements. For manufacturing efficiency, lamination is typically performed with a "book" that includes multiple pages.

Figure 4:
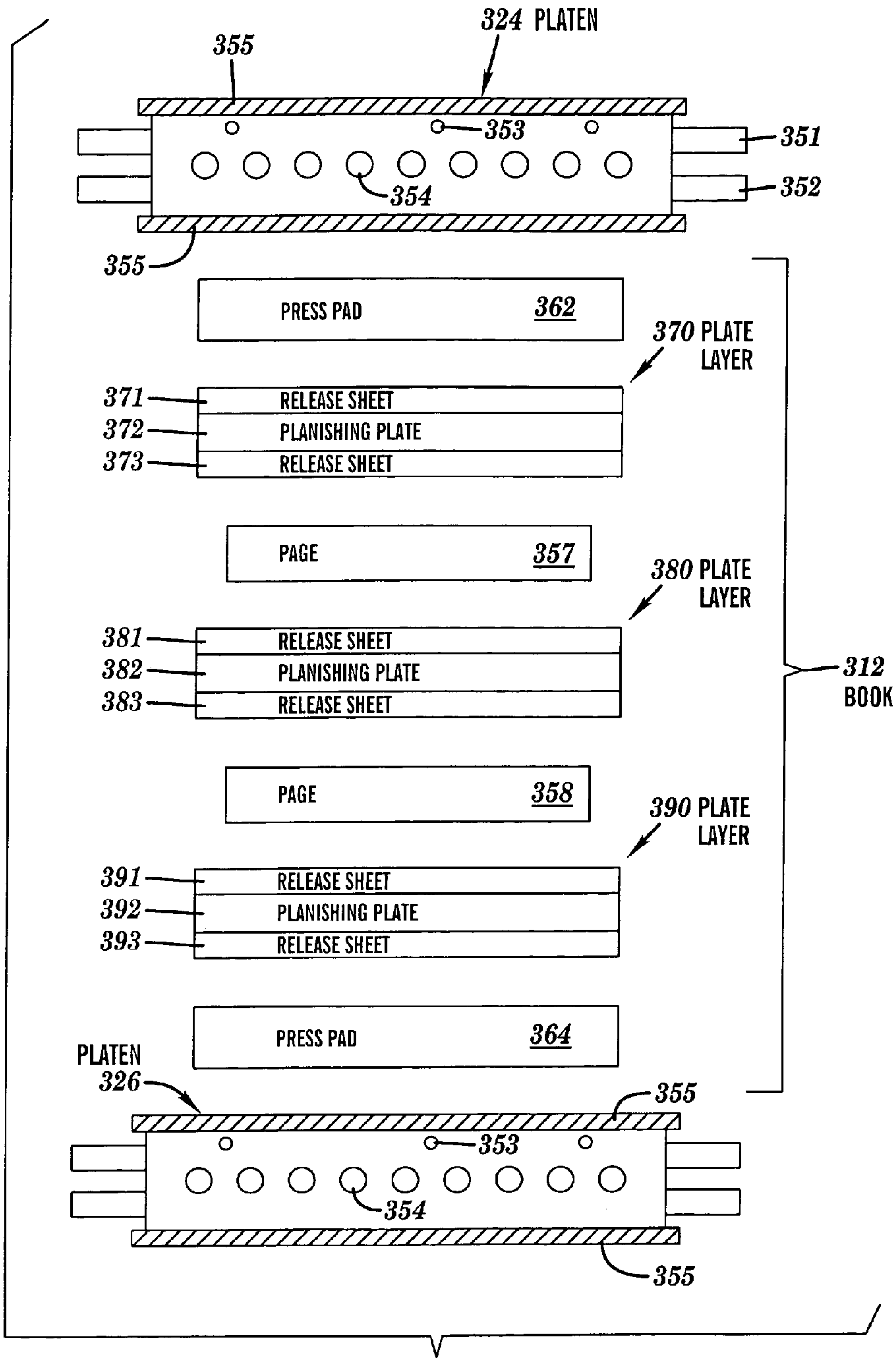
Figure 5:
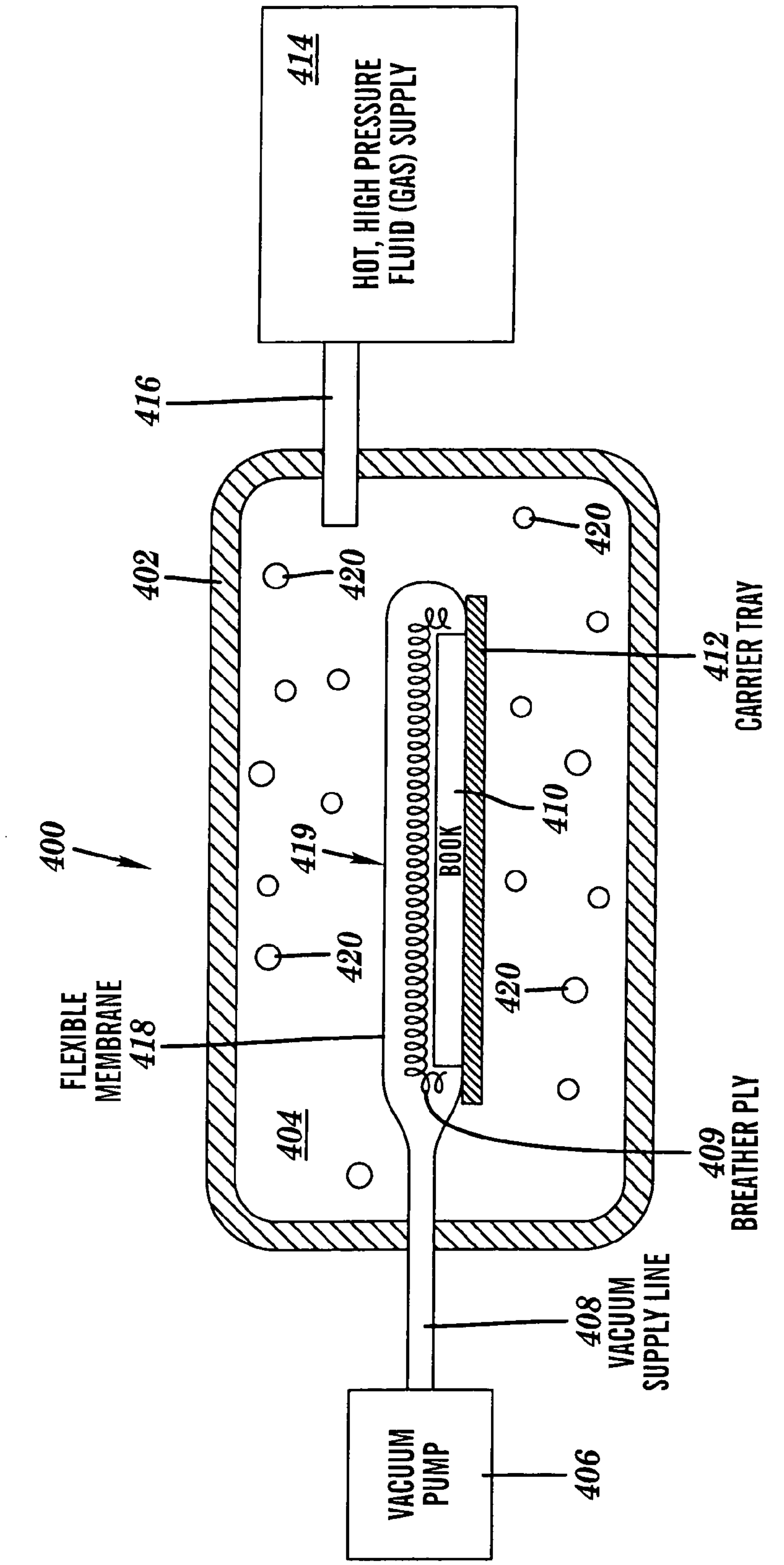
FIG. 5 illustrates an autoclave lamination press for lamination of stacked layers that include LCP dielectric material, in accordance with embodiments of the present invention.

The following discussion discloses two practical methods of performing lamination of a multi-layered interconnect structure (called a "page"), namely flat-bed press lamination (see FIGS. 3–4) and autoclave lamination (see FIG. 5).

Figure 3:
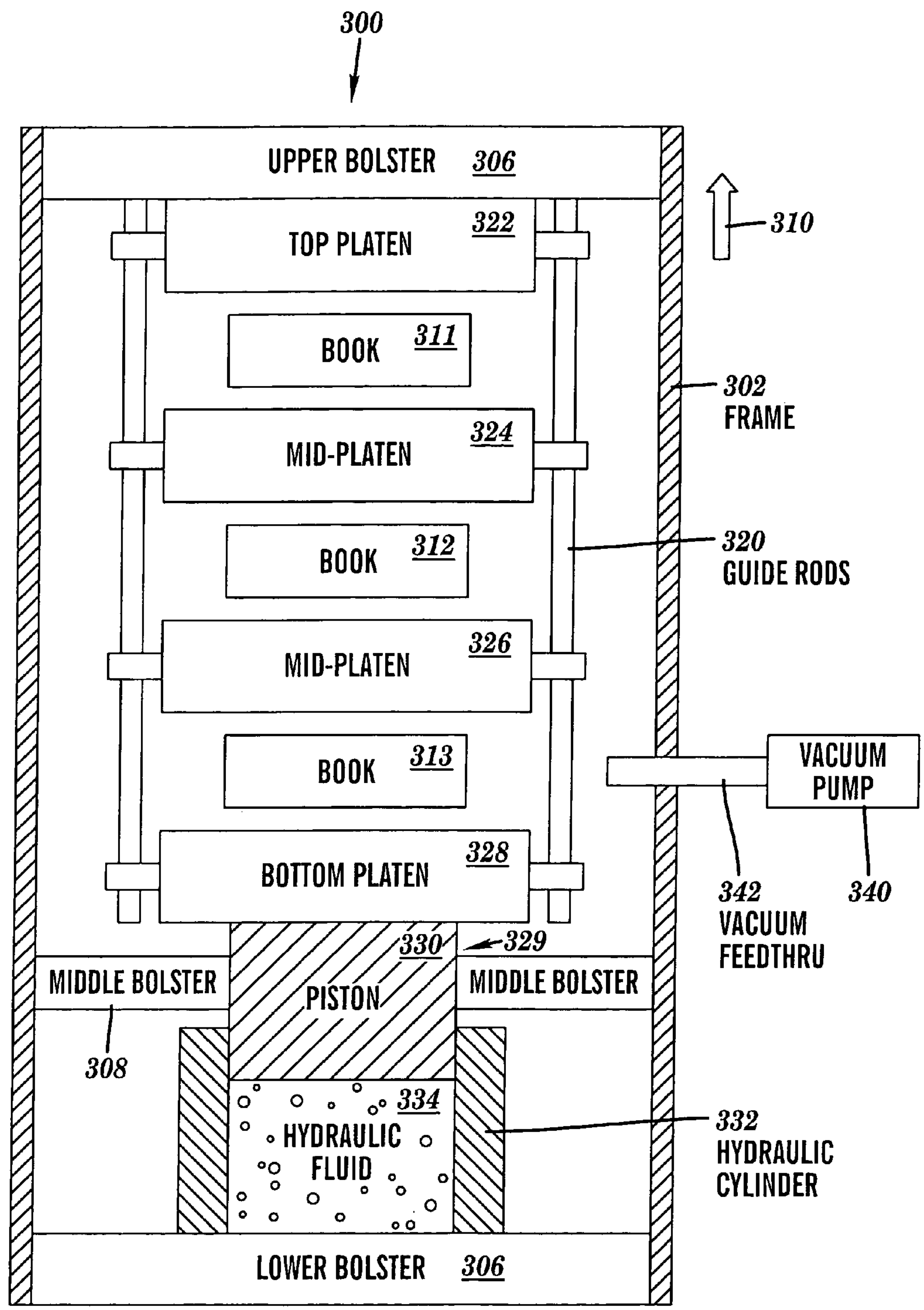
FIGS. 3 and 4 illustrate flat-bed press lamination for lamination of stacked layers that include LCP dielectric material, in accordance with embodiments of the present invention.

FIGS. 3 and 4 illustrate flat-bed press lamination for lamination of stacked layers that include LCP dielectric material, in accordance with embodiments of the present invention. In FIG. 3, a flat-bed lamination press 300 is enclosed and structurally supported by a frame 302. FIG. 3 depicts a three-opening flat-bed lamination press 300 that has an upper bolster 304, a middle bolster 308, a lower bolster 306, a top platen 322, mid-platens 324 and 326, a bottom platen 328, books 311–313, guide rods 320, a hydraulic system 329, a vacuum pump 340, and a vacuum feedthru 342. The platens 322, 324, 326, and 328 and books 311–313 may be supported from below by the middle bolster 308 and are constrained from above by the upper bolster 304. The platens 322, 324, 326, and 328 are supported laterally and guided vertically by the guide rods 320. The hydraulic system 329 comprises a hydraulic cylinder 332, hydraulic fluid 334, a piston 330, and a pump (not shown) that circulates the hydraulic fluid 334 by use of a supply line (not shown) that is coupled to the pump. The hydraulic cylinder 334 is used to apply pressure to the platens. Typical operating pressures for the hydraulic fluid 334 are in a range of up to 5000 psi. The pressure applied to the books depends on the relative size of the book versus the diameter of the hydraulic piston 330. With the present invention, pressures in a range of, inter alia, about 1000 to about 3000 psi may be applied to the product layers within the books. The chamber of the press may be subject to a vacuum generated by the vacuum pump 340 with the vacuum feedthru 342, so as to minimize oxidation and entrapment of voids during lamination processing. Alternatively, the vacuum pump 340 may be omitted, or turned off and not used during lamination press operation. Not shown are the feedthroughs and supply lines for the platen heating and cooling systems which could be electrically or fluid heated, and fluid cooled.

Book 311 is disposed between top platen 322 and mid-platen 324. Book 312 is disposed between mid-platen 324 and mid-platen 326. Book 313 is disposed between mid-platen 326 and bottom platen 328. While FIG. 3 shows three books 311–313, the flat-bed lamination press 300 may process at least one of such books and as many books as can fit geometrically between the upper bolster 304 and the middle bolster 308, in consideration of the thickness in the direction 310 of the platens and the books. Each of books 311–313 comprises one or more pages, and each page comprises multiple layers and/or multilayered structures to be laminated together by pressurization through movement of the piston 330 in the direction 310 such that each book is compressed between the platens that contact the book on each side of the book (e.g., the book 312 is compressed between the platens 324 and 326). The multiple layers and/or multilayered structures of each page comprise one or more LCP dielectric layers. Upon actuation of the press, the piston 330 moves up in the direction 310 and platens 322, 324, 326, and 328 come into contact with books 311–313. The platens that contact the books during the lamination process not only provide surfaces for compressing the books during lamination, but also provide a heat source for elevating the temperature of the LCP dielectric layers in each page of each book as will be explained infra.

FIG. 4 shows the detailed structure of book 312 and platens 324 and 326 of FIG. 3, in accordance with embodiments of the present invention. The book 312 comprises an alternating sequence of plate layers and pages between press pads 362 and 364. In particular, the book 312, comprises the alternating sequence of: plate layer 370, page 357, plate layer 380, page 358, and plate layer 390. The plate layer 370 comprises a planishing plate 372 sandwiched between release sheets 371 and 373. The planishing plate 372 assists in planarizing the page 357. Various considerations are made in selecting the material of the planishing plate 372, including its thickness, size, and thermal expansion characteristics. In many applications, the planishing plate 372 may comprise stainless steel. The release sheets 371 and 373 should comprise a material (e.g, copper) that enables the plate layer to be easily detached from the page 357 after completion of the lamination processing. The plate layer 380 comprises a planishing plate 382 sandwiched between release sheets 381 and 383, and the planishing plate 382 and release sheets 381 and 383 are respectively analogous to the planishing plate 372 and release sheets 371 and 373. The plate layer 390 comprises a planishing plate 392 sandwiched between release sheets 391 and 393, and the planishing plate 392 and release sheets 391 and 393 are respectively analogous to the planishing plate 372 and release sheets 371 and 373. The press pads 362 and 364 may include a compliant material to give more uniform lamination by compensating for spatial thickness non-uniformities in the pages and release sheets.

Platens 324 and 326 are similarly constructed. In platen 324, heating elements 354 may generate heat in any form that is known to one of ordinary skill in the art such as generation of heat by electrical resistance heaters or by a heated circulating fluid (e.g., oil). Inlet tube 351 and outlet tube 352 are use to circulate fluid (e.g., air, water, etc.) through the platen 324 for cooling purposes. Platen 324 also includes thermocouple ports 353 for using thermocouples to measure platen 324 temperatures. Platen 324 is bounded by wear plates 355 for planarizing the book 312 as the book 312 is pressurized. The wear plates 355 are thermally conductive and transmit heat generated by the heating elements 354 to the book 312. The wear plates 355 should have good thermal conductivity and may comprise hardened steel in some applications.

FIG. 5 illustrates an autoclave lamination press for lamination of stacked layers that include LCP dielectric material, in accordance with embodiments of the present invention. In FIG. 5, an autoclave 400 comprises a chamber 404 surrounded by an enclosure 402. The chamber 404 comprises a vacuum bag 419 enclosed by flexible membrane 418. A book 410 is placed within the vacuum bag 419. The vacuum bag 419 can have various configurations, but it must completely envelope the book 410, and provide some flexibility so that the vacuum bag 419 will conform to the book 410 upon evacuation (described infra). The vacuum bag 419 and the book 410 therewithin are placed in the chamber 404 which is then sealed. The vacuum bag 419 may also include a breather ply 409 for the purpose of facilitating complete evacuation of the vacuum bag 419. The vacuum bag 419 with the included book 410 is mechanically supported by a carrier tray 412. The flexible membrane 418 provides a pressure boundary that interfaces with a pressurized, heated gas 420 (e.g., nitrogen) within the portion of the chamber 404 that is exterior to the flexible membrane 418. The pressure differential between the space exterior to the flexible membrane 418 and the space within the vacuum bag 419 may be further controlled by evacuating the air from within the vacuum bag 419 by a vacuum pump 406 via a vacuum supply line 408. The pressurized, heated gas 420 is supplied to the chamber 404 by a source 414 through gas inlet tubing 416. Thus the gas 420 is a medium through which elevated temperature and pressure are applied to book 410 so as to laminate the pages contained within the book 410. The resulting laminations are similar to that achieved in a flat bed lamination press, in that compressive stresses normal to the book 410 are achieved. However, the pressure uniformity is generally improved by the use of the autoclave 400, since there is an absence of shear tractions on the outer surface of the book 410. Although FIG. 5 shows one vacuum bag 419, the scope of the present invention also includes a plurality of such vacuum bags within the chamber 404.

For both the flat bed lamination press and the autoclave lamination press, the temperatures, pressures, and dwell times are in accordance with the need to laminate one or more layers of LCP dielectric material to other layers of material, as discussed infra. Thus during the lamination process, the LCP dielectric material should be laminated at a temperature T wholly in the liquid crystal temperature range (i.e., $T<T_{NI}$) with no excursion into the isotropic temperature range, under sufficient pressurization and for a sufficient dwell time to cause the LCP dielectric material to be effectively laminated to the layer of material. For many applications, pressure in the range of 1000 to 3000 psi will effectuate good adhesion. The dwell time for maximum temperature and pressure should generally be at least 2 minutes, and applicable ranges of dwell times include, inter alia, 2 to 60 minutes and 15 to 30 minutes.

It is known in the art that for lamination of conventional thermoset dielectric layers (e.g. epoxy/glass pre-preg), comparable results (e.g., with respect to adhesion and flow) can be obtained at reduced pressure in an autoclave versus a flat bed press. This suggests that in the case of LCP lamination, reduced pressures (perhaps by as much as a factor of two) may be effective, and thus desirable for reducing costs associated with autoclave lamination.

In addition to use of the flat bed lamination press and the autoclave lamination press for laminating stacked LCP dielectric layers to other layers, other lamination press hardware known to one of ordinary skill in the art may be used for accomplishing such laminations in accordance with the aforementioned conditions on temperature, pressure, and dwell time.

The lamination process can be used to stack layers of LCP dielectric material with layers of dielectric material (i.e., either LCP dielectric or non-LCP dielectric) or metallic layers, (e.g., signal planes, power planes, ground planes, etc,), and signals thereof. With such stacking, attention should be given to achieving correct layer to layer alignment. Each copper clad dielectric core can have reference (fiducial) holes that are used for mechanical pins to provide layer to layer alignment. Both the photolithography steps to form circuit features and the lamination process can utilize these reference holes. Special tooling that includes plates with corresponding holes that accommodate the pins are used. The reference holes in the dielectric cores can be formed prior to and used as a reference for the photolithography steps, or alternately, they can be formed after the photolithography steps and then drilled in reference to the circuit features. This technique allows for calculation of the optimal location for the pin holes, given that some distortion or size change of the core may have occurred during the photolithography (especially for thin layers). A further alternative is to use a means of optical alignment, where the circuit features on the cores are detected, and then the layers are positioned and held in place for the lamination process, without using any pins.

Figure 6A:
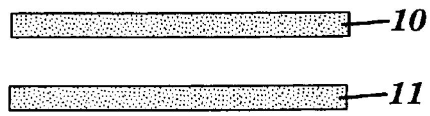
FIGS. 6A–6B depicts lamination of a LCP dielectric layer to a dielectric layer, in accordance with embodiments of the present invention.
Figure 6B:
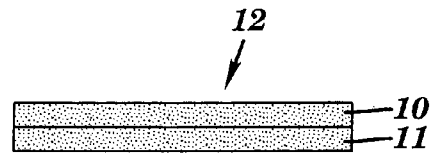
Figure 7A:
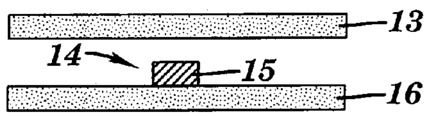
FIGS. 7A–7B depicts lamination of a LCP dielectric layer to a DS substructure, in accordance with embodiments of the present invention.
Figure 7B:
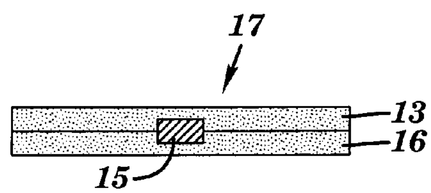
Figure 8A:
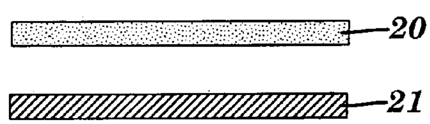
FIGS. 8A–8B depicts lamination of a LCP dielectric layer to a power plane, in accordance with embodiments of the present invention.
Figure 8B:
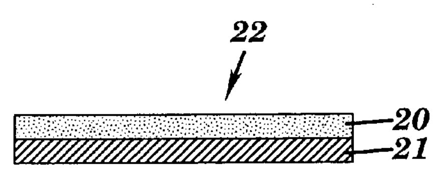
Figure 9A:
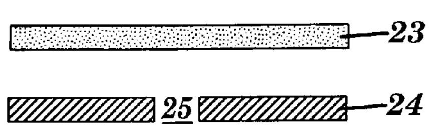
FIGS. 9A–9B depicts lamination of a LCP dielectric layer to a power plane having a hole therethru, in accordance with embodiments of the present invention.
Figure 9B:
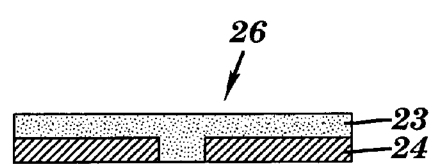
Figure 10A:
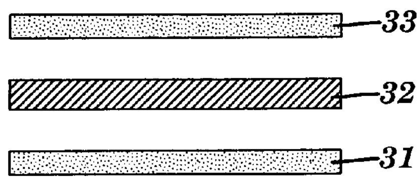
FIGS. 10A–10B depict lamination of first and second LCP dielectric layers to opposing surfaces of a power plane, in accordance with embodiments of the present invention.
Figure 10B:
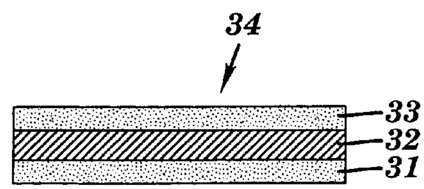

The following Figures depict laminations involving one or more LCP dielectric layers: FIGS. 6A–6B (collectively "FIG. 6"); FIGS. 7A–7B (collectively "FIG. 7"); FIGS. 8A–8B (collectively "FIG. 8"); FIGS. 9A–9B (collectively "FIG. 9"); FIGS. 10A–10B (collectively "FIG. 10"); and FIGS. 11A–11B (collectively "FIG. 11"). For the laminations associated with FIGS. 6–11 as well as for the laminations described infra in conjunction with FIGS. 12–13, all laminations of a dielectric layer to an adjacent surface, wherein the dielectric layer comprises a LCP dielectric material, are performed at a lamination temperature that is wholly within the liquid crystal temperature range (i.e., $T<T_{NI}$) of the LCP dielectric material, with no excursion into the isotropic temperature range, under sufficient pressurization (e.g., 1000 to 3000 psi) and for a sufficient dwell time to cause the LCP dielectric material to be effectively laminated to the adjacent surface. The dwell time for maximum temperature and pressure should generally be at least 2 minutes, and applicable ranges of dwell times include, inter alia, 2 to 60 minutes and 15 to 30 minutes. If multiple LCP dielectric layers and/or multiple LCP dielectric substructures are concurrently laminated to respective adjacent surfaces, then the value of $T_{NI}$ to be employed for satisfying $T<T_{NI}$ is the lowest value of $T_{NI}$ of all LCP dielectric materials included within said LCP multiple dielectric layers and/or multiple LCP dielectric substructures. All LCP dielectric layers are assumed to comprise a LCP dielectric material. The preceding combination of temperature, pressure, and dwell time conditions will be referred to infra as the "inventive TPD conditions."

Figure 13:
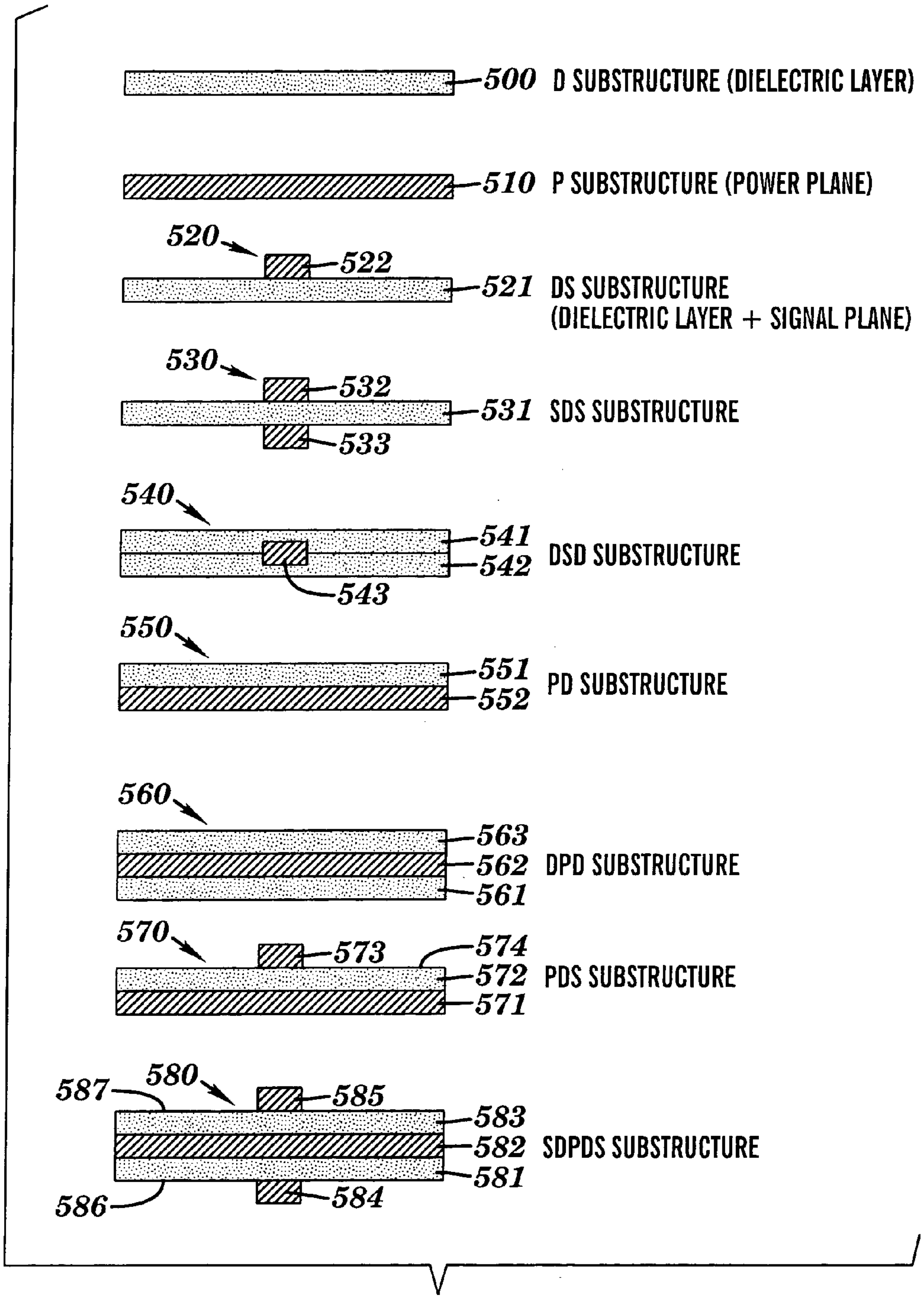
FIG. 13 is a table of substructures, in accordance with embodiments of the present invention.

FIG. 13 shows various substructures which serve a building blocks for laminations performed in accordance with the present invention.

In FIG. 13, substructure 500 is a "D" substructure which is a dielectric layer comprising any type of dielectric material known to one of ordinary skill in the art (e.g., organic dielectric material; ceramic dielectric material; LCP dielectric material; non-LCP dielectric material; etc.). If substructure 500 comprises a LCP dielectric material, then substructure 500 is a LCP D substructure. If substructure 500 does not comprise a LCP dielectric material, then substructure 500 is a non-LCP D substructure.

Substructure 510 is a "P" substructure, also called a "power plane" which is a continuously conductive layer (e.g., metal, metallic alloy, etc.) and may include one or more holes (not shown) within the continuous conductive layer, said holes formed by any method known to one of ordinary skill in the art (e.g., chemical etching, laser drilling, etc.)

Substructure 520 is a "DS" substructure comprising a signal plane 522 on a D substructure 521. The D substructure 521 is a dielectric layer comprising any type of dielectric material known to one of ordinary skill in the art (e.g., organic dielectric material; ceramic dielectric material; LCP dielectric material; non-LCP dielectric material; etc.). A signal plane is characterized by its inclusion of a layer comprising electrically conductive circuitry. The substructure 520 may be formed by any method known to one of ordinary skill in the art. For example, it may be possible to purchase the D substructure 521 already laminated to a continuous metal sheet (e.g., copper cladded dielectric material) or alternatively plate (or otherwise deposit) the continuous metal sheet on the D substructure 521 as is known in the art. Then the substructure 520 may be formed by patterning the metal sheet with photolithography followed by chemical etching of metal in the metal sheet to form the circuit lines of the signal plane 522.

Substructure 530 is a "SDS" substructure comprising signal planes 532 and 533 on opposite faces of a D substructure 531. The D substructure 531 is a dielectric layer comprising any type of dielectric material known to one of ordinary skill in the art (e.g., organic dielectric material; ceramic dielectric material; LCP dielectric material; non-LCP dielectric material; etc.). The substructure 530 may be formed by any method known to one of ordinary skill in the art. For example, metal sheets could by plated, as is known in the art, to the opposite faces of a D substructure 531. Then the substructure 530 may be formed by patterning the metal sheets with photolithography followed by chemical etching of metal in the metal sheets to form the signal planes 532 and 533.

Substructure 540 is a "DSD" substructure comprising a signal plane 543 interfaced between D substructure 541 and D substructure 542. The D substructures 541 and 542 are each a dielectric layer comprising any type of dielectric material known to one of ordinary skill in the art (e.g., organic dielectric material; ceramic dielectric material; LCP dielectric material; non-LCP dielectric material; etc.). The substructure 540 may be formed by any method known to one of ordinary skill in the art. For example, one could start with a DS substructure (e.g., DS substructure 520 described supra) and then laminate a D substructure onto the DS substructure such that the D substructure laminates to the signal plane surface of the DS substructure. If at least one of D substructures 541 and 542 is a LCP dielectric layer, then substructure 540 may be formed in accordance with the present invention as discussed infra in conjunction with FIG. 7.

Substructure 550 is a "PD" substructure comprising a D substructure 551 laminated to a P substructure 552. The D substructure 551 is a dielectric layer comprising any type of dielectric material known to one of ordinary skill in the art (e.g., organic dielectric material; ceramic dielectric material; LCP dielectric material; non-LCP dielectric material; etc.). The substructure 550 may be formed by any method known to one of ordinary skill in the art. For example, it may be possible to purchase the substructure 550. As another example, it is possible to plate a continuous metal sheet on the D substructure 551 as is known in the art.

Substructure 560 is a "DPD" substructure comprising a P substructure 562 interfaced between D substructure 561 and D substructure 563. The D substructures 561 and 563 are each a dielectric layer comprising any type of dielectric material known to one of ordinary skill in the art (e.g., organic dielectric material; ceramic dielectric material; LCP dielectric material; non-LCP dielectric material; etc.). The substructure 560 may be formed by any method known to one of ordinary skill in the art. For example, starting with a PD substructure (e.g., PD substructure 550 described supra) comprising D substructure 561 laminated to a first surface of P substructure 562, one can laminate D substructure 563 to a second surface of P substructure 562 that is opposite the first surface of P substructure 562.

Substructure 570 is a "PDS" substructure comprising a P substructure 571 laminated to a DS substructure that includes signal plane 573 on D substructure 572. The P substructure 571 is laminated to a surface of the D substructure 572 wherein said surface does not include the signal plane 573. The D substructure 572 is a dielectric layer comprising any type of dielectric material known to one of ordinary skill in the art (e.g., organic dielectric material; ceramic dielectric material; LCP dielectric material; non-LCP dielectric material; etc.). The substructure 570 may be formed by any method known to one of ordinary skill in the art. For example, starting with a PD substructure comprising power plane 571 laminated to a first surface of D substructure 572, one could form a signal plane 573 on surface 574 of D substructure 572 as described supra in conjunction with forming signal line 522 in the DS substructure 520.

Substructure 580 is a "SDPDS" substructure comprising: signal plane 585 on D substructure 583, signal plane 584 on D substructure 581, and D substructures 581 and 583 respectively laminated to opposing surfaces of P substructure 582, as shown. The D substructures 581 and 583 are each a dielectric layer comprising any type of dielectric material known to one of ordinary skill in the art (e.g., organic dielectric material; ceramic dielectric material; LCP dielectric material; non-LCP dielectric material; etc.). The substructure 580 may be formed by any method known to one of ordinary skill in the art. For example, starting with a DPD substructure comprising P substructure 582 interfaced between D substructures 581 and 583, one could form a signal planes 584 and 585 on surfaces 586 and 587 of D substructure 581 and 582, respectively, as described supra in conjunction with forming signal line 522 in the DS substructure 520.

FIGS. 6–11 depict laminations involving one or more LCP dielectric layers:

FIGS. 6A–6B depicts lamination of a LCP dielectric layer 10 to D substructure 11 to form a substructure 12, according to the inventive TPD conditions in accordance with embodiments of the present invention. The dielectric layer 11 may comprise any type of dielectric material known to one of ordinary skill in the art (e.g., organic dielectric material; ceramic dielectric material; LCP dielectric material; non-LCP dielectric material; etc.).

FIG. 7A–7B depicts lamination of a LCP dielectric layer 13 to a DS substructure 14 to form substructure 17, according to the inventive TPD conditions in accordance with embodiments of the present invention. The DS substructure 14 comprises a signal plane 15 on a dielectric layer 16. The dielectric layer 16 may comprise any type of dielectric material known to one of ordinary skill in the art (e.g., organic dielectric material; ceramic dielectric material; LCP dielectric material; non-LCP dielectric material; etc.). It is to be noted that substructure 17 is a DSD substructure (see FIG. 13).

FIG. 8A–8B depicts lamination of a LCP dielectric layer 20 to a power plane 21, to form substructure 22 according to the inventive TPD conditions in accordance with embodiments of the present invention. It is to be noted that substructure 22 is a PD substructure (see FIG. 13).

FIG. 9A–9B depicts lamination of a LCP dielectric layer 23 to a power plane 24 having a hole 25 therethru to form substructure 26, according to the inventive TPD conditions in accordance with embodiments of the present invention. FIG. 9 shows that the lamination process caused the hole 25 to be filled with the dielectric material from LCP dielectric layer 23. It is to be noted that substructure 26 is a PD substructure (see FIG. 13).

FIG. 10A–10B depicts concurrent lamination of LCP dielectric layers 31 and 33 to opposing surfaces of a power plane 32 to form substructure 34, according to the inventive TPD conditions in accordance with embodiments of the present invention. It is to be noted that substructure 34 is a DPD substructure (see FIG. 13).

Figure 11A:
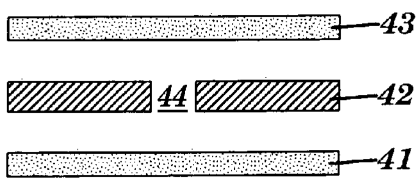
FIGS. 11A–11B depict lamination of first and second LCP dielectric layers to opposing surfaces of a power plane having a hole therethrough, in accordance with embodiments of the present invention.
Figure 11B:
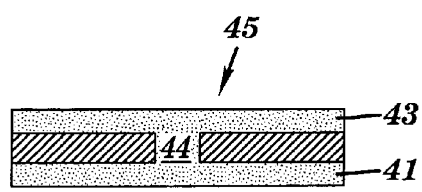

FIG. 11A–11B depicts concurrent lamination of LCP dielectric layers 41 and 43 to opposing surfaces of a power plane 42 having a hole 44 therethrough, to form substructure 45 according to the inventive TPD conditions in accordance with embodiments of the present invention. FIG. 11 shows that the lamination process caused the hole 44 to be filled with the dielectric material from dielectric layer 41, dielectric layer 43, or a combination thereof. It is to be noted that substructure 45 is a DPD substructure (see FIG. 13).

Figure 12:
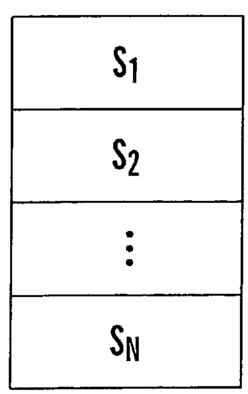
FIG. 12 depicts an ordered stacking of substructures, in accordance with embodiments of the present invention.

FIG. 12 depicts an ordered stacking of N substructures $S_1$, $S_2$, . . . $S_N$ ($N \geqq 2$) to form a laminated page, in accordance with embodiments of the present invention. Each of said N substructures represents any substructure listed in FIG. 13, or any substructure that can be formed from laminating together a combination of substructures listed in FIG. 13, provided that the following condition is satisfied: a first substructure of each pair of adjacent substructures of the N substructures comprises liquid crystal polymer (LCP) dielectric material to be bonded with a second substructure of said pair of adjacent substructures. Then the page comprising the ordered stack of N substructures is laminated according to the inventive TPD conditions in accordance with embodiments of the present invention.

It should be noted that fabrication of structures and substructures may include additional processing steps such as, inter alia, drilling and plating both blind vias and through holes as in known to a person of ordinary skill in the art. A purpose of features such as plated blind vias and plated through holes is to make layer to layer electrical connections.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A multi-layered structure, comprising:

a first layer; and a second layer, wherein the first layer comprises a first liquid crystal polymer (LCP) dielectric material, and wherein the first layer is bonded to the second layer such that the first LCP material is directly bonded to the second layer with no extrinsic adhesive material bonding the first LCP material to the second layer, wherein the first LCP dielectric material has a polymer chain structure and associated directional orientation that is essentially the same as the polymer chain structure and associated directional orientation that existed in the first LCP dielectric material prior to the bonding of the first layer to the second layer.

2. The multi-layered structure of claim 1, wherein the first LCP dielectric material has a coefficient of thermal expansion (CTE) that is essentially the same as the CTE that existed in the first LCP dielectric material prior to the bonding of the first layer to the second layer.

3. A multi-layered structure, comprising:

a first layer; and a second layer, wherein the first layer comprises a first liquid crystal polymer (LCP) dielectric material, and wherein the first layer is bonded to the second layer such that the first LCP material is directly bonded to the second layer with no extrinsic adhesive material bonding the first LCP material to the second layer, wherein the second layer is a dielectric layer that does not comprise any LCP dielectric material.

4. The multi-layered structure of claim 1, wherein the second layer comprises a second LCP dielectric material, and wherein the first and second LCP materials are directly bonded to each other with no extrinsic adhesive material bonding the first LCP material to the second LCP material.

5. A multi-layered structure, comprising:

a first layer; and a second layer, wherein the first layer comprises a first liquid crystal polymer (LCP) dielectric material, and wherein the first layer is bonded to the second layer such that the first LCP material is directly bonded to the second layer with no extrinsic adhesive material bonding the first LCP material to the second layer, wherein the second layer comprises a dielectric material, wherein the multi-layered structure further comprises a signal plane embedded within an interior portion of the multi-layered structure such that the signal plane is in contact with the first and second layers, and wherein the signal plane includes a layer comprising electrically conductive circuitry.

6. A multi-layered structure, comprising:

a first layer; and a second layer, wherein the first layer comprises a first liquid crystal polymer (LCP) dielectric material, and wherein the first layer is bonded to the second layer such that the first LCP material is directly bonded to the second layer with no extrinsic adhesive material bonding the first LCP material to the second layer, wherein the second layer comprises a power plane that is bonded to the first LCP dielectric material of the first layer with no extrinsic adhesive material bonding the first LCP material to the power plane, and wherein the power plane comprises a continuous conductive layer.

7. The multi-layered structure of claim 6, wherein the power plane comprises a hole therethrough, and wherein the hole is filled with the first LCP dielectric material.

8. The multi-layered structure of claim 6, further comprising a third layer comprising a second LCP dielectric material, wherein the third layer is bonded to the second layer such that the second layer is sandwiched between the first layer and the third layer, and wherein the second LCP material is directly bonded to the power plane with no extrinsic adhesive material bonding the second LCP material to the power plane.

9. The multi-layered structure of claim 8, wherein the power plane comprises a hole therethrough, and wherein the hole is filled with a material selected from the group consisting of the first LCP dielectric material, the second LCP dielectric material, and combinations thereof.

10. The multi-layered structure of claim 6, wherein the first LCP dielectric material has a coefficient of thermal expansion (CTE) that is essentially the same as the CTE that existed in the first LCP dielectric material prior to the bonding of the first layer to the second layer.

11. The multi-layered structure of claim 6, wherein the second layer comprises a second LCP dielectric material, and wherein the first and second LCP materials are directly bonded to each other with no extrinsic adhesive material bonding the first LCP material to the second LCP material.

12. The multi-layered structure of claim 5, wherein the first LCP dielectric material has a coefficient of thermal expansion (CTE) that is essentially the same as the CTE that existed in the first LCP dielectric material prior to the bonding of the first layer to the second layer.

13. The multi-layered structure of claim 5, wherein the second layer comprises a second LCP dielectric material, and wherein the first and second LCP materials are directly bonded to each other with no extrinsic adhesive material bonding the first LCP material to the second LCP material.

14. The multi-layered structure of claim 3, wherein the first LCP dielectric material has a coefficient of thermal expansion (CTE) that is essentially the same as the CTE that existed in the first LCP dielectric material prior to the bonding of the first layer to the second layer.

* * * * *